(12) United States Patent
Widdershoven et al.

(10) Patent No.: US 6,472,706 B2
(45) Date of Patent: Oct. 29, 2002

(54) SEMICONDUCTOR DEVICE

(75) Inventors: Franciscus Petrus Widdershoven;
Jurriaan Schmitz, both of Eindhoven (NL)

(73) Assignee: Koninklijke Philips Electronics NV, Eindhoven (NL)

( * ) Notice: Subject to any disclaimer, the term of this patent is extended or adjusted under 35 U.S.C. 154(b) by 0 days.

(21) Appl. No.: 09/902,920

(22) Filed: Jul. 11, 2001

(65) Prior Publication Data
US 2002/0005545 A1 Jan. 17, 2002

(30) Foreign Application Priority Data
Jul. 12, 2000 (EP) .............................................. 00202493

(51) Int. Cl.$^7$ .............................................. H01L 29/72
(52) U.S. Cl. ........................ 257/314; 257/315; 257/318; 257/324; 365/185
(58) Field of Search ................................ 257/314, 315, 257/318, 324; 365/185

(56) References Cited

U.S. PATENT DOCUMENTS

| | | | |
|---|---|---|---|
| 5,041,886 A | 8/1991 | Lee | 357/23.5 |
| 5,073,513 A | 12/1991 | Lee | 437/43 |
| 5,293,328 A | 3/1994 | Amin et al. | 365/185 |
| 5,408,115 A | 4/1995 | Chang | 257/324 |
| 5,583,811 A | * 12/1996 | Houdt et al. | 257/314 |
| 5,612,237 A | 3/1997 | Ahn | 437/43 |
| 5,910,912 A | 6/1999 | Hsu et al. | 365/185 |
| 6,011,725 A | 1/2000 | Eitan | 365/185 |
| 6,133,098 A | * 10/2000 | Ogura et al. | 257/315 |

FOREIGN PATENT DOCUMENTS

| | | | |
|---|---|---|---|
| DE | 19612676 A | 2/1997 | H01L/27/115 |
| WO | 9913513 A1 | 3/1999 | |

OTHER PUBLICATIONS

PHN 17,331, U.S. Ser. No. 09/520,060, Filed: Mar. 7, 2000 (EP 99200697.3).

* cited by examiner

Primary Examiner—Edward Wojciechowicz
(74) Attorney, Agent, or Firm—Aaron Waxler

(57) ABSTRACT

A semiconductor device comprising a non-volatile memory cell, for storing at least one bit, in a semiconductor substrate (1) having, in the substrate, a source region (6), a drain region (7) and a channel region (10) between the source (6) and drain (7) regions, and having, on top of the substrate, a floating gate (9) separated from the channel region (10) by a floating gate insulating layer, a select gate (11) adjacent to the floating gate and separated from the channel region by a select gate insulating layer (8), and a control gate (5) separated from the floating gate (9) by a control gate insulating layer, the floating gate being a non-conducting charge trapping dielectric layer (9).

12 Claims, 5 Drawing Sheets

SEMICONDUCTOR DEVICE

Figure 1:
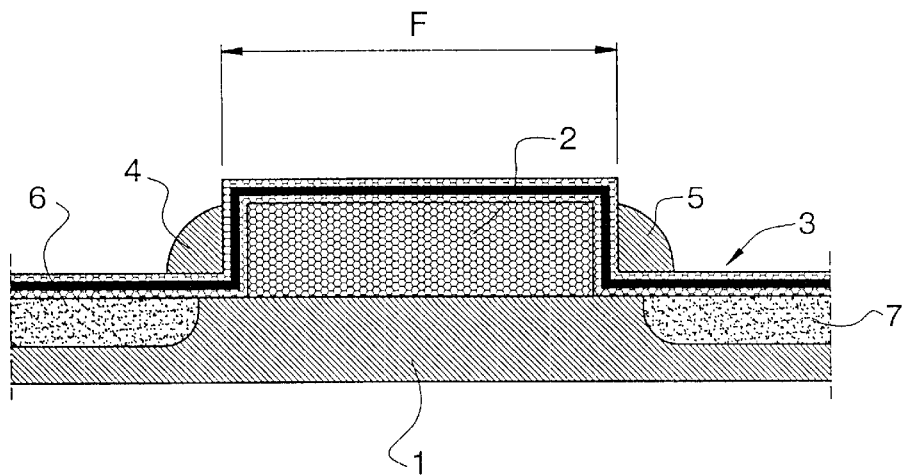

The present invention relates to a semiconductor device comprising non-volatile memory cells in a semiconductor substrate, each one of the memory cells comprising, in said substrate, a source region, a drain region and a channel region between said source and drain regions, and comprising, on top of said substrate, a floating gate separated from said channel region by a floating gate insulating layer, a select gate adjacent to said floating gate and separated from said channel region by a select gate insulating layer, and a control gate separated from said floating gate by a control gate insulating layer.

Non-volatile memory (NVM) cells are used in FlashROM and EEPROM applications. Such a semiconductor device comprising NVM cells each containing one transistor, is known from U.S. Pat. No. 5,612,237. In such a 1T NVM cell, a first and a second electrode (known as source and drain) are formed on a p-Si substrate. Between the two electrodes an insulating layer is formed on the p-Si substrate to insulate the channel region between the source and drain regions. On the insulating layer a floating gate is formed. On top of the floating gate structure a control gate is formed to control the transistor.

As is known to persons skilled in the art, in a structure as described above, the floating gate can be electrically charged by electrons from the underlying p-Si, in a process known as hot-electron-injection. Due to the insulation of the floating gate the electrons are trapped in the floating gate.

The potential of the floating gate is controlled by the amount of charge that is trapped on the floating gate, and by the control gate. The presence of a negative electric charge on the floating gate changes the conducting properties of the transistor, which can be used in semiconductor non-volatile memory cells. Circuitry within a semiconductor memory device can determine the logic state ("1", "0") of the cell.

A disadvantage of the known semiconductor device, however, is that erasure of the cell by emission of the electric charge from the floating gate can result in over-erasure, which charges the floating gate positively, causing bit line leakage if the cell is not charged subsequently, i.e. remains in the low-threshold voltage state.

As is known to those versed in the art, to overcome this problem 2T NVM cells comprising two transistors are applied in semiconductor non-volatile memory devices. A 2T NVM cell consists of a floating gate transistor (as found in a 1T cell) in series with an access transistor. Additional advantages are the relatively low read voltages and the reduced susceptibility to failure during programming, erasure and reading. Such a semiconductor device comprising a 2T NVM cell is known from U.S. Pat. No. 5,041,886, 5,073,513, 5,293,328, 5,583,811 and 5,910,912, as well as from WO99/13513. In the 2T NVM cell known from U.S. Pat. No. 5,910,912, in between source and drain regions, an insulating layer is formed on a p-Si substrate to create a channel region. On this insulating layer two gates, i.e. a select gate and a floating gate, are formed, which are separated by an insulating sidewall. Both gates are covered by an insulating layer. On this structure a control gate is formed, which covers the complete floating gate and part of the select gate. Both the select gate and the floating gate are formed as sidewall spacers. Thus, the dimensions of the structure formed by the select gate and the floating gate are smaller than the dimensions obtainable with optical lithography. However, the cell size of this 2T NVM cell structure is still limited by lithographic processing. Due to the accuracy of alignment observed in subsequent lithographic steps to form the control gate on top of the floating gate and, partly, on top of the select gate, an overlap of the structures is required, and some additional oversizing of structures is usually allowed for. Due to this consideration, and since the smallest dimension of the control gate is determined by feature size F, the cell size will be larger than the feature size F, which is defined here as the smallest size that can be transferred by lithography (for a given technology level and a given generation of semiconductor devices).

In U.S. Pat. No. 6,011,725, a non-volatile EEPROM is disclosed that is able to store two bits of information in a non-conducting charge trapping dielectric layer, e.g. silicon nitride, in between two silicon dioxide layers.

It is an object of the present invention to provide a semiconductor device comprising a semiconductor non-volatile memory device of the EEPROM or FlashROM type, in which the memory cell comprises at least one bit and the cell size, in a preferred embodiment, can be reduced to a surface area of $1F^2$.

In a first preferred embodiment, the present invention relates to a semiconductor device comprising a non-volatile memory cell, for storing at least one bit, in a semiconductor substrate comprising, in the substrate, a source region, a drain region and a channel region between the source and drain regions, and comprising, on top of the substrate, a floating gate separated from the channel region by a floating gate insulating layer, a select gate adjacent to the floating gate and separated from the channel region by a select gate insulating layer, and a control gate separated from the floating gate by a control gate insulating layer, wherein the control gate is produced as a sidewall spacer and the floating gate is a non-conducting charge trapping dielectric layer.

In this embodiment, and in further embodiments, the non-conducting charge trapping dielectric layer consists of a silicon nitride layer.

Furthermore, in this first embodiment, the present invention relates to a semiconductor device comprising at least two adjacent non-volatile memory cells, as defined above, which at least two adjacent memory cells are arranged in a virtual ground arrangement.

In such a semiconductor device, the area of a non-volatile memory cell that can be allotted to one bit equals a surface area of $4\ F^2$, where F is defined as the smallest size that can be transferred by lithography.

In a second preferred embodiment, the present invention relates to a semiconductor device, as defined above, comprising at least first and second subsets of nonvolatile memory cells as defined above, wherein the first subset comprises two adjacent memory cells sharing a first select gate line extending in a first direction, and the second subset comprises two further adjacent memory cells arranged next to the first subset in a second direction perpendicular to the first direction and sharing a second select gate line extending in the first direction, the first and second gate lines being separated by a thin insulating layer.

Moreover, in the second preferred embodiment, the present invention also relates to a semiconductor device, wherein the memory cells of the first subset are arranged in a virtual ground arrangement, and the memory cells of the second subset are also arranged in a virtual ground arrangement.

In such a semiconductor device, the area of a non-volatile memory cell that can be allotted to one bit equals a surface area of $2\ F^2$.

In a third preferred embodiment, the present invention relates to a semiconductor device comprising a memory cell, as defined above with respect to the first embodiment, which, for storing a second bit, comprises, on top of the substrate, a further floating gate separated from the channel region by a further floating gate insulating layer, and a further control gate separated from the further floating gate by a further control gate insulating layer, wherein the further control gate is produced so as to be a sidewall spacer and the further floating gate is a further non-conducting charge trapping dielectric layer.

Moreover, in this third embodiment, the present invention also relates to a semiconductor device comprising at least two adjacent non-volatile memory cells, as defined above with respect to this embodiment, wherein the at least two adjacent memory cells are arranged in a virtual ground arrangement.

In such a semiconductor device, the area of a non-volatile memory cell that can be allotted to one bit equals a surface area of 2 $F^2$.

In a fourth embodiment, the present invention relates to a semiconductor device as defined in the third embodiment, comprising at least first and second subsets of non-volatile memory cells as defined in the third embodiment, wherein the first subset comprises two adjacent memory cells sharing a first select gate line extending in a first direction, and the second subset comprises two further adjacent memory cells arranged next to the first subset in a second direction perpendicular to the first direction and sharing a second select gate line extending in the first direction, the first and second gate lines being separated by a thin insulating layer.

Furthermore, in the fourth embodiment, the present invention relates to a semiconductor device, wherein the memory cells of the first subset are arranged in a virtual ground arrangement, and the memory cells of the second subset are also arranged in a virtual ground arrangement.

In such a semiconductor device, the area of a non-volatile memory cell that can be allotted to one bit equals a surface area of 1 $F^2$.

These and other aspects of the invention will be apparent from and elucidated with reference to the embodiments (s) described hereinafter.

Figure 2:
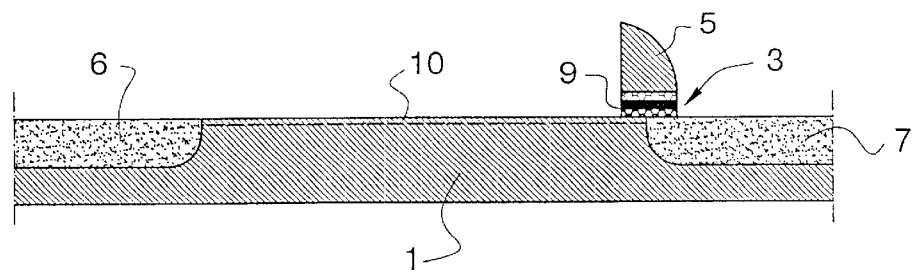
Figure 3:
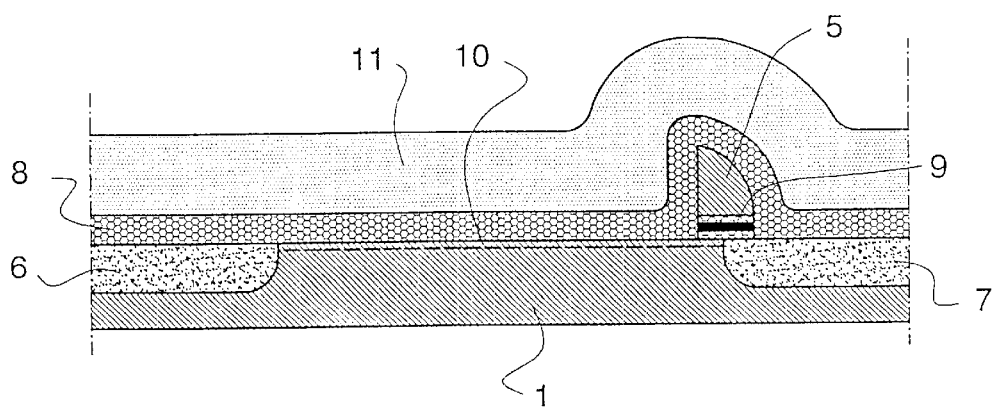
Figure 4:
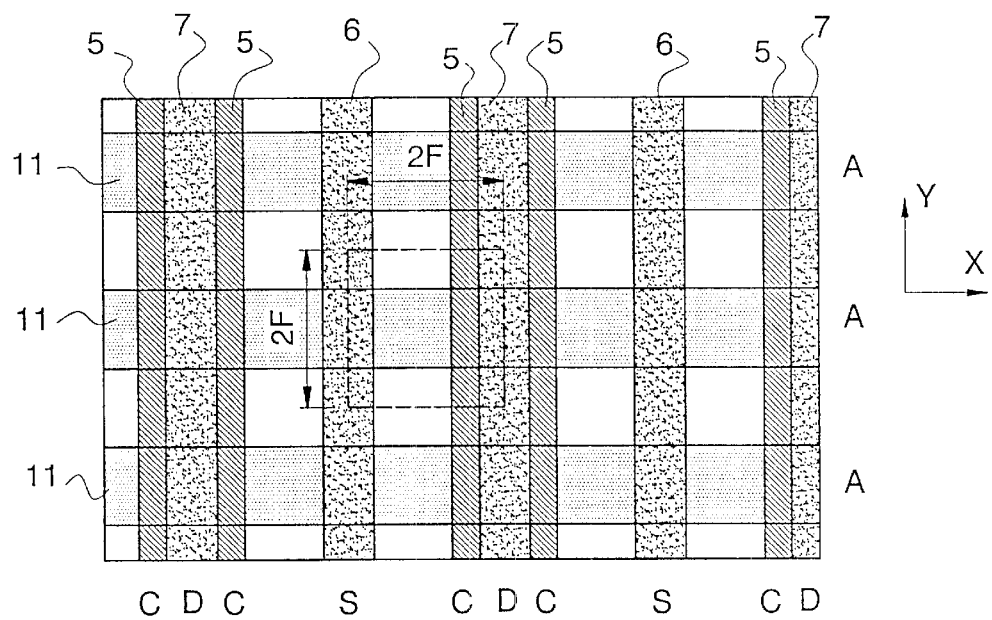
Figure 5:
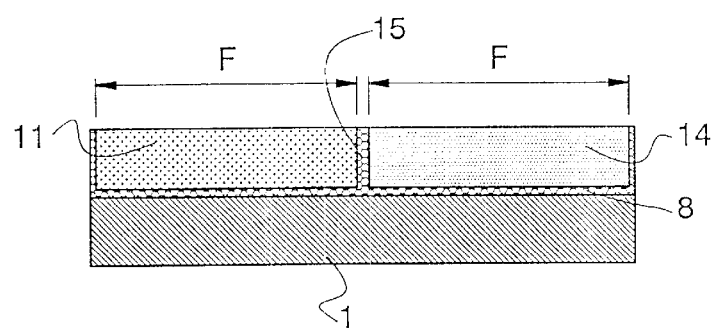
Figure 6:
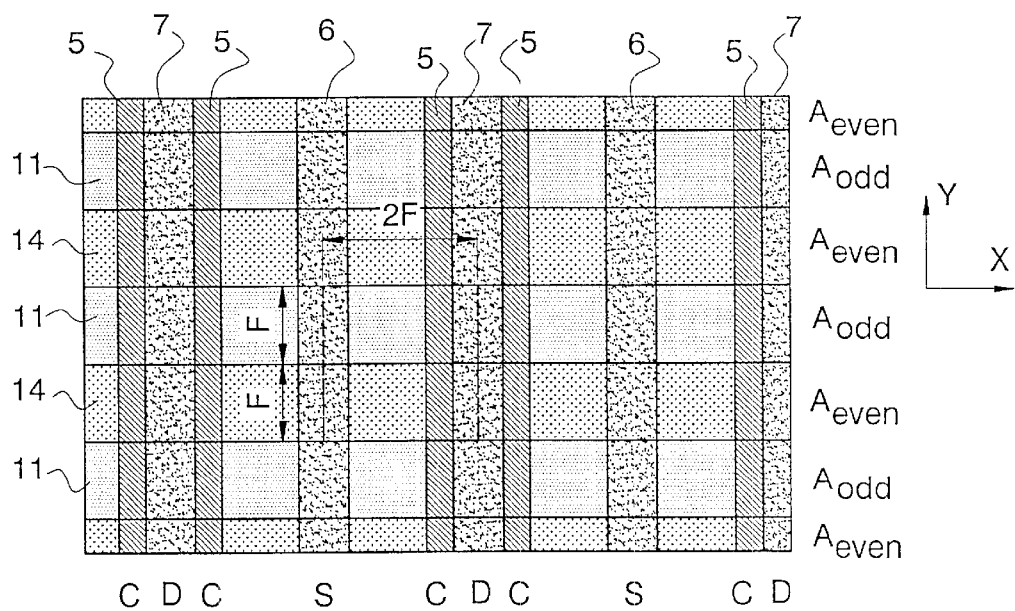
Figure 7:
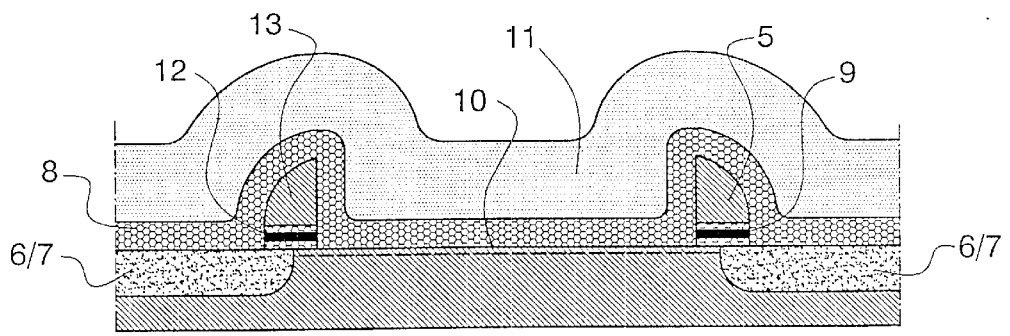
Figure 8:
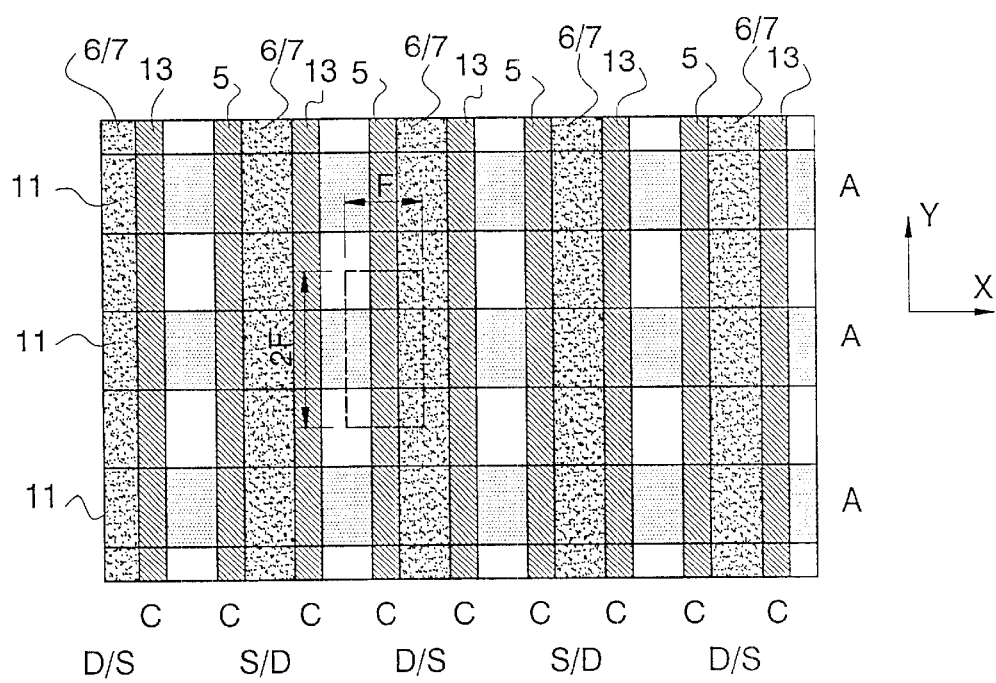
Figure 9:
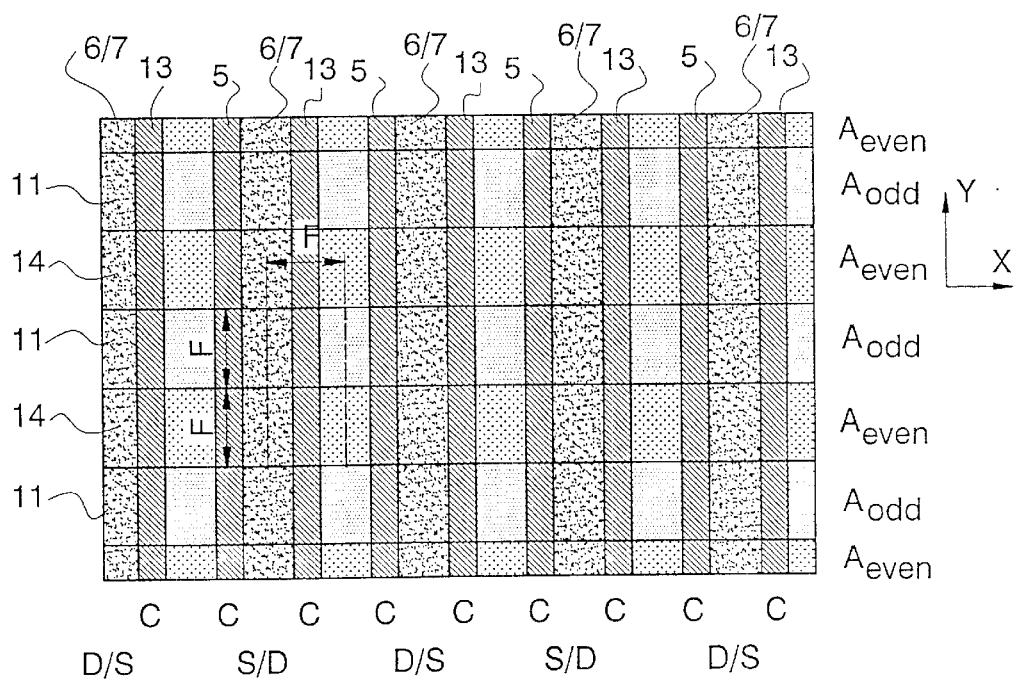
Figure 10:
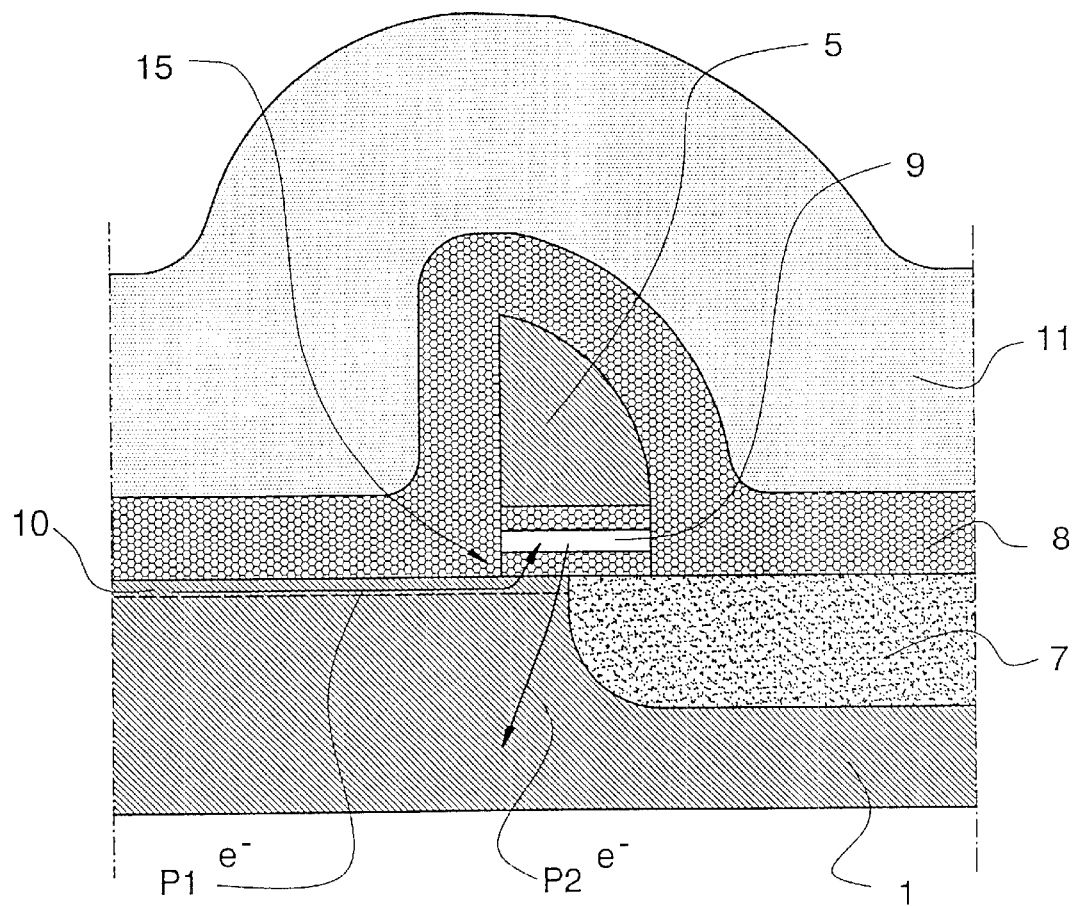

In the drawings:

FIG. 1 schematically shows a cross-section of a memory cell after the process step determining feature size F;

FIG. 2 schematically shows a cross-section of a memory cell after the step in which a control gate and a floating gate of a NVM cell are formed;

FIG. 3 schematically shows a cross-section of a NVM cell after the formation of an access gate;

FIG. 4 schematically shows a top view of a part of a memory matrix comprising NVM cells as shown in FIG. 3;

FIG. 5 schematically shows a cross-section of interdigitated access gates separated by thin insulating sidewalls;

FIG. 6 schematically shows a top view of a part of a memory matrix comprising NVM cells with interdigitated access gates in a second preferred embodiment;

FIG. 7 schematically shows a cross-section of a non-volatile memory cell according to a third preferred embodiment of the present invention;

FIG. 8 schematically shows a top view of a part of a memory matrix comprising NVM cells as shown in FIG. 7;

FIG. 9 schematically shows a top view of a part of a memory matrix comprising NVM cells with interdigitated access gates in a fourth preferred embodiment;

FIG. 10 schematically shows the transport mechanisms of electrons in a NVM cell as shown in FIG. 3, to program the floating gate and to erase the floating gate.

The present invention proposes a method to fabricate NVM cells with floating gates consisting, preferably, of a silicon nitride trapping layer in a virtual ground architecture. In the case of the most compact embodiment, the effective area per stored bit can be reduced to 1$F^2$. To obtain such a high density of memory cells, the method provides stacked layers of silicon dioxide ($SiO_2$), silicon nitride and silicon dioxide (ONO layer) and a control gate formed by a poly-Si spacer on top of the ONO layer. The control gate spacer is self-aligned parallel to the drain line (acting as a bit line), and optionally also to the source line, of a NVM cell. The access gate line, consisting of poly-Si, is aligned perpendicularly to the drain and source lines and constitutes the word line of the NVM cell matrix.

In the following, a method will be described to fabricate a matrix of memory cells according to the present invention by using processing technologies known in the art, such as e.g., deposition, lithography, reactive ion etching, implantation, and chemical mechanical polishing. It is to be understood that the method allows the use of any known processing technology, but is in no way limited there to, to fabricate a matrix of memory cells according to the present invention.

FIG. 1 schematically shows a cross-section of a memory cell after the process step determining feature size F. The substrate 1 is covered by a $SiO_2$ layer (having a thickness of e.g., 100 nm). Then the $SiO_2$ layer is provided with a pattern of lines perpendicular to the cross-section of FIG. 1 by etching with a mask. During patterning, the feature size F of a dummy gate 2 is limited by the lithographic process. An ONO layer 3 is deposited (e.g., a 7 nm thick bottom $SiO_2$ layer, a 5 nm thick $Si_3N_4$ layer and a 10 nm thick $SiO_2$ top layer) which covers the p-Si substrate 1, and the dummy gate 2. Subsequently, a poly-Si layer (having a thickness of e.g. 50 nm) is deposited on the ONO layer 3. Optionally, the poly-Si layer is n-type doped by a phosphorous implant and (subsequently) an anneal, or is doped in-situ with phosphorous. By anisotropically etching the poly-Si layer, spacers 4, 5 are formed. Persons skilled in the art will appreciate that the spacers 4, 5 are self-aligned with respect to the dummy gate 2. Next, an n-type dopant (e.g., As) is implanted to form the source 6 and drain 7 regions. In this process step, the spacers 4, 5 are doped as well. The source 6 and drain 7 regions are self-aligned with respect to the dummy gate, which acts as an implantation mask. In this way, the source and drain regions are provided with a pattern of lines perpendicular to the cross-section of FIG. 1.

FIG. 2 schematically shows a cross-section of a memory cell after the step in which a control gate and a floating gate of a NVM cell are formed. First, the left spacer 4 close to source 6 is removed by etching with a mask. Then the ONO layer 3 and the dummy gate 2 are removed in a process step in which spacer 5 and the underlying ONO layer are retained. The spacer 5 serves as a control gate, and the $Si_3Ni_4$ layer of the ONO layer as a floating gate 9. Both control gate 5 and floating gate 9 are provided with a pattern of lines, perpendicular to the cross-section of FIG. 2. Here, a silicon nitride trapping layer is used as the floating gate, but a doped poly-Si layer may be used instead. However, when poly-Si is used, floating gates need to be mutually isolated. When silicon nitride is used, it is not necessary to isolate adjacent floating gates because of the low mobility of electrons in the nitride layer. Thus, a single linear ONO layer can be used for a plurality of adjacent floating gates. A channel region 10 is defined between source 6 and drain 7 regions.

FIG. 3 schematically shows a cross-section of a NVM cell after the formation of an access gate 11. First, a gate oxide 8 (e.g., 8 nm thick or less) is grown on the source region 6, the channel region 10 and the control gate 5. If the control gate 5 is doped with a high dose of As the oxide on top of the control gate 5 will become thicker (e.g. 20 nm) than on the channel region 10. A similar effect occurs on top of the source 6 and drain 7 regions. Then, a poly-Si layer (e.g. 100 nm thick) is deposited. This poly-Si layer is doped and patterned in order to serve as access gate 11. The access gate 11 is patterned so as to be line-shaped, parallel to the cross-section of FIG. 3.

FIG. 4 schematically shows a top view of a part of a memory matrix comprising NVM cells, one of which being shown in FIG. 3. Control gate lines 5 and underlying floating gates 9 (not visible in FIG. 4) extend in a vertical direction indicated by means of arrow Y. The source 6 and drain 7 regions for each cell also extend in the vertical direction, thus providing a cell arrangement known as a virtual ground arrangement. Access gate lines 11 run in a horizontal direction indicated by means of arrow X. The square depicted by the dashed lines represents a NVM cell (comprising one bit per cell) having a surface of $4F^2$, where F is the feature size as defined in the patterning of the dummy gate 2.

Alternatively, in a second preferred embodiment, a cell area of $2F^2$ per stored bit can be obtained by doubling the number of access gates in a NVM cell matrix as shown in FIGS. 3 and 4, in which only one floating gate 9 is provided adjacent to the drain region 7. The space between two access gates 11 can be filled with a second level of poly-Si lines acting as access gates 14, as schematically shown in FIG. 5, which schematically shows a cross-section of interdigitated access gates separated by thin insulating sidewalls. This can be achieved by a method disclosed in European patent application 99200697.3, which can be considered to be prior art in accordance with Art. 54(3),(4) EPC. The interdigitated access gate lines 11 and 14 are separated by a thin sidewall 15, preferably of $SiO_2$. The pitch of the access gate lines is given by the feature size F.

FIG. 6 schematically shows a top view of part of a memory matrix comprising NVM cells with interdigitated access gates as shown in FIG. 5. Control gate lines 5 and underlying floating gates 9 extend in a vertical direction indicated by means of arrow Y. Interdigitated access gate lines 11 and 14 run in a horizontal direction indicated by means of arrow X. In FIG. 6, the rectangle depicted by the dashed lines, represents the area of the cell according to the cross-section in FIG. 7 that can be allotted to one bit, the cell having a surface area of $2F^2$, where F is the feature size as defined in the patterning of the dummy gate 2 (and the access gate lines 11, 14).

In the first and the second embodiment, in each NVM cell one floating gate 9 is found which facilitates the storage of one bit in the cell. However, in a third preferred embodiment of the present invention, both spacers 4 and 5 are retained in a process similar to that described in FIG. 2. Floating gates 9, 12 and control gates 5, 13 are formed at both source 6 and drain 7 regions. Now, with each NVM cell comprising two floating gates 9, 12, two bits per cell can be stored. FIG. 7 schematically shows a cross-section of a non-volatile memory cell according to the third preferred embodiment of the present invention.

FIG. 8 schematically shows a top view of part of a memory matrix comprising NVM cells, one of which being shown in FIG. 7. Control gate lines 5 and underlying floating gates 9 (not visible in FIG. 8) adjacent to drain lines 7, and control gate lines 13 and underlying floating gates 12 adjacent to source lines 6, extend in a vertical direction indicated by means of arrow Y. Similar to the arrangement shown in FIG. 4, a virtual ground arrangement for the source 6 and drain 7 regions is provided. Access gate lines 11 run in a horizontal direction indicated by means of arrow X.

The memory cell described by FIGS. 7 and 8 comprises three transistors for storing two bits. Actually, the memory cell is formed by the superposition of the two transistor memory cells for storing one bit, as shown in FIG. 3, and a similar two-transistor memory cell for storing one bit, in which, relative to the floating gate 5, the source 6 and drain 7 regions have been exchanged in comparison with the memory cell of FIG. 3. In this third preferred embodiment, the access gate 11 of the memory cell of FIG. 3 is shared by that memory cell and the 'mirrored' memory cell, which leads to a reduction of the total number of transistors in the memory cell of FIGS. 7 and 8 to three.

In FIG. 8, the rectangle depicted by the dashed lines, represents the area of the cell according to the cross-section in FIG. 7 that can be allotted to one bit, the cell having a surface area of $2F^2$, where F is the feature size as defined in the patterning of the dummy gate 2. In a fourth preferred embodiment, the NVM cell size can be reduced further to a surface area of $1F^2$ per stored bit. In this embodiment, the cell layout comprising two interdigitated access gate lines 11, 14 is combined with the cell layout comprising two floating gates 9, 12 adjacent to common source 6 and drain 7 regions as shown in FIGS. 7 and 8.

FIG. 9 schematically shows a top view of part of a memory matrix comprising NVM cells of such an embodiment. Control gate lines 5 and underlying floating gates 9 adjacent to drain lines 7, and control gate lines 13 and underlying floating gates 12 adjacent to source lines 6, extend in a vertical direction indicated by means of arrow Y. Interdigitated access gate lines 11 and 14 run in a horizontal direction indicated by means of arrow X. In FIG. 9, the square depicted by the dashed lines represents the area of the cell that can be allotted to one bit, the cell having a surface area of $1F^2$, where F is the feature size as defined in the patterning of the dummy gate 2 and the access gate lines 11, 14.

Programming of NVM cells according to the present invention is preferably carried out using the mechanism of source-side-injection (SSI), as is known in the art. FIG. 10 schematically shows the transport mechanisms of electrons in a NVM cell, as shown in FIG. 3, to program the floating gate, and to erase the floating gate. In FIG. 10, a part of a NVM cell is shown, comprising one control gate 5 and one floating gate 9 adjacent to the drain 7, as disclosed in the first embodiment (FIG. 3). On the p-Si substrate 1, the drain 7, the floating gate 9, the control gate 5, the gate oxide and channel region 10, and the access gate 11 are shown. Typically, for programming (i.e. electrically charging the floating gate with electrons), the potential of source 6 is set at 0V (zero), the drain 7 potential at 3 V, the control gate 8 at 8V, and the potential of the access gate at 0.5V. With this setting, the access transistor is biased close to its threshold voltage and a small current will flow in the channel region 10 from the source 6 towards the drain 7. The electrons are accelerated by the lateral electric field between access gate and control gate, and become energetic (hot). At the so-called injection point 15, hot electrons $e^-$ have gained sufficient energy in the lateral field to cross the energy barrier of the bottom $SiO_2$ layer and become trapped in the $Si_3N_4$ layer, as indicated by means of an arrow P1. Since only a single cell must be programmed at a time, other cells that share the same word line (access gate line) should not be programmed and should have a potential of 0V (zero) at both their respective control gate and drain. When such a cell shares a drain line with another cell that is being programmed, a control gate potential of zero volt is not sufficient to prevent undesired programming by hot electrons that may be generated by the cell's leakage current. In that case, the former cell's potential at the control gate should be set at a slightly negative value (e.g., −3V). The leakage current in the former cell can be relatively high because its access gate transistor is in the conducting state and its floating gate transistor is too short to block the current path, even if 0V is applied to its control gate.

In an embodiment of NVM cells with two control gates 5 and 13 (and their respective floating gates 9 and 12) adjacent to drain 7 and source 6, respectively, programming of the cell comprising control gate 5 and floating gate 9 is carried out as described above. To program the cell comprising control gate 13 and floating gate 12, the voltages on source 6 and drain 7 are interchanged (source 6 at 3V, drain 7 at 0V, control gate 13 at 8V, access gate 14 at 0.5V). This method is known from the prior art as disclosed in U.S. Pat. No. 6,011,725. Since the hot electrons e⁻ gain energy while accelerated by the lateral field in the channel region 10, the hot electrons only have sufficient energy to cross the oxide barrier at the injection point of the cell (comprising control gate 13 and floating gate 12). In a NVM cell matrix of each of the embodiments as shown in FIGS. 4, 6, 8 and 9, programming of only those cells with the right combination of bias voltages as described above will take place: the programming step is cell-selective.

It should be noted that programming should not interfere with an adjacent cell (control gate 5 and floating gate 9), therefore the voltages applied are sufficiently low to prevent loss of charge from the latter cell. Below, the erasure mechanism will be discussed in more detail.

Erasure of a stored bit in a cell is done preferably by means of the mechanism of Fowler-Nordheim tunnelling of trapped electrons from the floating gate 9, 12 to the substrate 1. This mechanism is also schematically depicted in FIG. 10. The tunnelling of trapped electrons e⁻ is indicated by arrow P2.

To erase a cell, access gate 11, source 6 and drain 7 are all set at a potential of 0V (zero), while the control gate 5 is set at −14V. (To erase the cell comprising control gate 13 and floating gate 12, voltage settings are: access gate 14, source 6 and drain 7 at 0V, control gate 13 at −14V).

All cells that share a control gate line will be erased simultaneously: i.e. the erase step is not cell-selective. In FlashROM applications this functionality can be used to erase all cells in a sector (i.e., a block of cells in a matrix). Also, it is possible to just erase all cells that share a control gate line, which allows the update of the content of a single column of cells (when located as in FIGS. 6, 8 and 9) without influencing neighboring columns. This can be used to implement EEPROM functionality by arranging the words to be stored in columns rather than in rows, which configuration is usually employed in EEPROM applications.

Alternatively, the erasure of cells can be accomplished by Fowler-Nordheim tunnelling of electrons from the floating gate 9 to control gate 5 (or from floating gate 12 to control gate 13, respectively). In case this erase procedure is to be used; the $SiO_2$ layer between the $Si_3N_4$ layer and the control gate 8, 13 should be thinner than the bottom $SiO_2$ layer in the ONO stack. Erasure is done by setting the voltage at the control gate 8, 13 at +14V, while all other voltages are set at 0V. This method can be advantageously used to prevent the use of large negative voltages in the semiconductor memory device. As known to persons skilled in the art, the latter alternative erasure procedure permits the same FlashROM and EEPROM functionality as in the former erase procedure.

What is claimed is:

1. A semiconductor device comprising a non-volatile memory cell, for storing at least one bit, in a semiconductor substrate (1) comprising, in said substrate, a source region (6), a drain region (7) and a channel region (10) between said source (6) and drain (7) regions, and comprising, on top of said substrate, a floating gate (9) separated from said channel region (10) by a floating gate insulating layer, a select gate (11) disposed above said floating gate and separated from said channel region by a select gate insulating layer (8), and a control gate (5) separated from said floating gate (9) by a control gate insulating layer, wherein said control gate (5) is produced as a sidewall spacer and said floating gate is a non-conducting charge trapping dielectic layer (9), and wherein the non-volatile memory cell has a surface area less than or equal to $4F^2$.

2. A semiconductor device according to claim 1, wherein said non-conducting charge trapping layer is made of silicon nitride.

3. A semiconductor device according to claim 1, wherein at least one further non-volatile memory cell is present next to said non-volatile memory cell.

4. A semiconductor device according to claim 3, wherein said at least two adjacent memory cells are arranged in a virtual ground arrangement.

5. A semiconductor device according to claim 3, comprising at least first and second subsets of non-volatile memory cells, wherein said first subset comprises two adjacent memory cells sharing a first select gate line (11) extending in a first direction, and said second subset comprises two further adjacent memory cells arranged next to said first subset in a second direction perpendicular to said first direction and said second subset sharing a second select gate line (14) extending in said first direction, said first (11) and second (14) gate lines being separated by a thin insulating layer.

6. A semiconductor device according to claim 5, wherein said memory cells of said first subset are arranged in a virtual ground arrangement, and said memory cells of said second subset are also arranged in a virtual ground arrangement.

7. A semiconductor device according to claim 1, for storing a second bit, comprising, on top of said substrate, a further floating gate (13) separated from said channel region (10) by a further floating gate insulating layer, and a further control gate (12) separated from said further floating gate (13) by a further control gate insulating layer, wherein said further control gate (12) is produced as a sidewall spacer and said further floating gate is a further non-conducting charge trapping dielectric layer (13).

8. A semiconductor device according to claim 7, wherein said further non-conducting charge trapping layer is made of silicon nitride.

9. A semiconductor device according to claim 7, wherein at least one further non-volatile memory cell is present next to said non-volatile memory cell.

10. A semiconductor device according to claim 9, wherein said at least two adjacent memory cells are arranged in a virtual ground arrangement.

11. A semiconductor device according to claim 9, comprising at least first and second subsets of non-volatile memory cells, wherein said first subset comprises two adjacent memory cells sharing a first select gate line (11) extending in a first direction, and said second subset comprises two further adjacent memory cells arranged next to said first subset in a second direction perpendicular to said first direction and said second subset sharing a second select gate line (14) extending in said. first direction, said first (11) and second (14) gate lines being separated by a thin insulating layer (15).

12. A semiconductor device according to claim 11, wherein said memory cells of said first subset are arranged in a virtual ground arrangement, and said memory cells of said second subset are also arranged in a virtual ground arrangement.

* * * * *